(12) United States Patent
Fujieda et al.

(10) Patent No.: US 6,815,654 B1
(45) Date of Patent: Nov. 9, 2004

(54) IMAGE SENSOR DEVICE USING THIN FILM LIGHT SOURCE ARRANGED LIGHT RECEIVING ELEMENTS AND IMAGE TO BE SENSED

(75) Inventors: Ichiro Fujieda, Tokyo (JP); Takeshi Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/932,238

(22) Filed: Sep. 17, 1997

(30) Foreign Application Priority Data

Sep. 18, 1996  (JP) ............................................. 8/246135

(51) Int. Cl.$^7$ ............................................. H01L 27/00
(52) U.S. Cl. .................... 250/208.1; 250/216
(58) Field of Search .............................. 250/208.1, 216, 250/239, 214.1; 257/290, 291, 440, 431, 432, 433; 358/482

(56) References Cited

U.S. PATENT DOCUMENTS

| | | | | |
|---|---|---|---|---|
| 5,101,099 A | * | 3/1992 | Funada et al. ............ | 250/208.1 |
| 5,254,849 A | * | 10/1993 | Murakami et al. ....... | 250/208.1 |
| 5,627,364 A | * | 5/1997 | Codama et al. .......... | 250/208.1 |

FOREIGN PATENT DOCUMENTS

| | | |
|---|---|---|
| JP | 5941629 | 10/1984 |
| JP | 62279775 | 12/1987 |
| JP | A 63-102361 | 5/1988 |
| JP | A 1-276962 | 11/1989 |
| JP | A 3-9659 | 1/1991 |
| JP | A 3-93344 | 4/1991 |
| JP | A 3-166857 | 7/1991 |
| JP | A 5-14620 | 1/1993 |
| JP | 5344280 | 12/1993 |
| JP | 758910 | 3/1995 |

* cited by examiner

*Primary Examiner*—Que T. Le
(74) *Attorney, Agent, or Firm*—Sughrue Mion, PLLC

(57) ABSTRACT

An image sensor device which optically reads out a document is disclosed, which comprises an image sensor (110) having a plurality of light receiving elements (112) arranged regularly facing a document to be read out; and a thin film light source (120) arranged tightly contacted on the document side of the image sensor (110), the thin film light source (120) emitting light to the document, wherein-the thin film light source (120) includes more than one light emission portion having a smaller area than that of a photoelectric conversion element, the light emission portion corresponding to each of the photoelectric conversion elements, and the light emission portion includes an opaque electrode (124) serving as a light blocking layer on the photoelectric conversion element side and is, arranged at a center of a lower surface of the photoelectric conversion element (112). A transparent substrate has a thickness of about 50 $\mu$m, the thin film light source (120) has a thickness of less than 1 $\mu$m, and the image sensor (110) has a thickness of less than 1 mm. The image sensor device has a thickness of about 1 mm, which is a total of these thicknesses. The image sensor device is small in size.

16 Claims, 13 Drawing Sheets

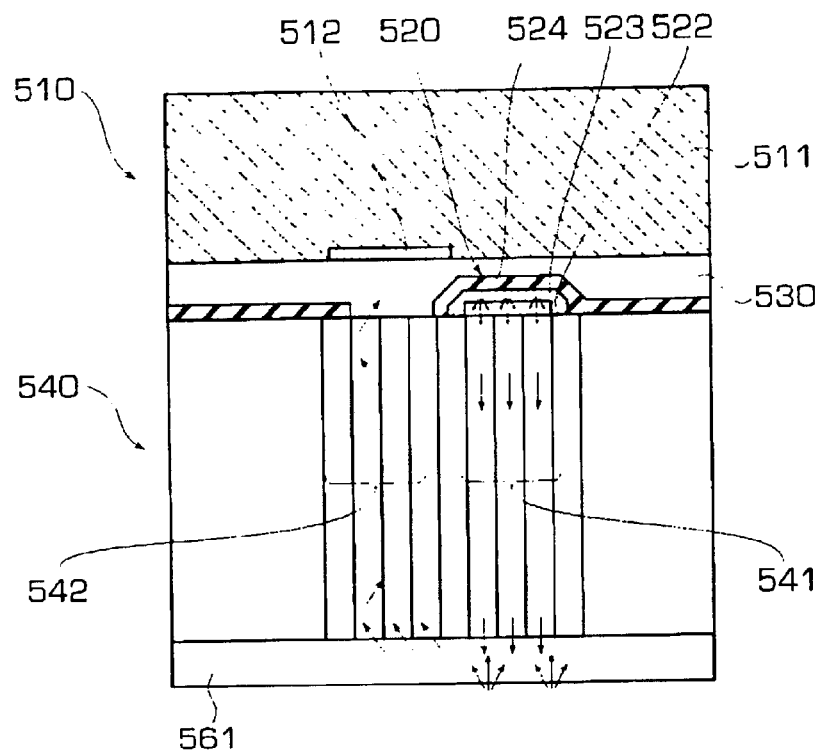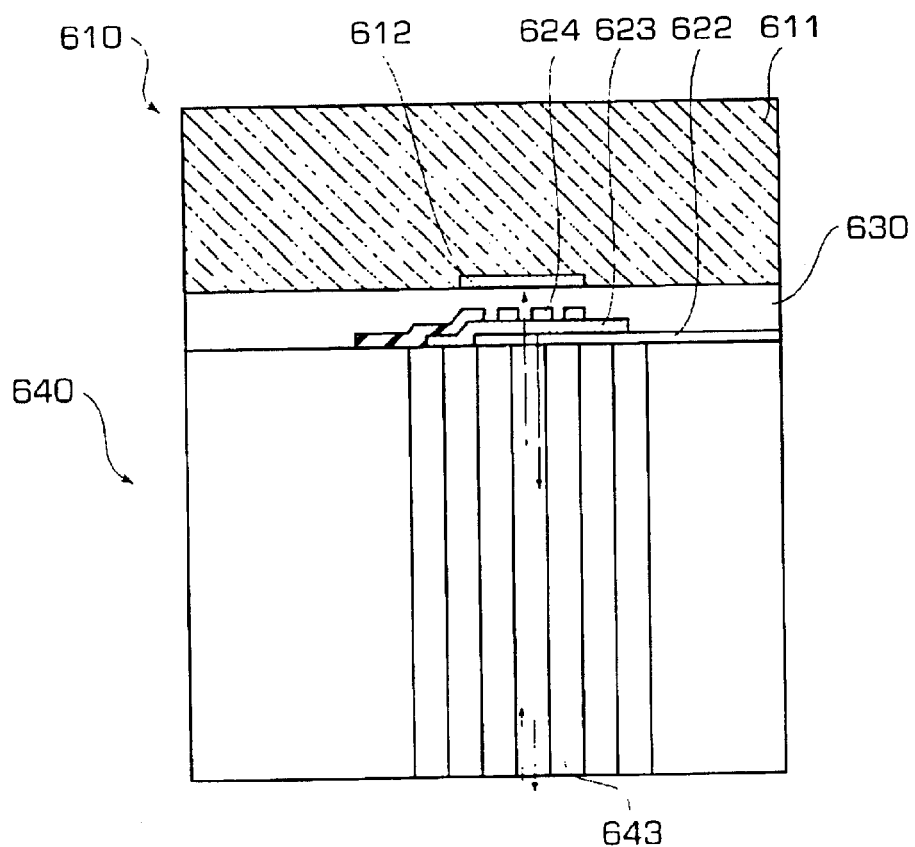

IMAGE SENSOR DEVICE USING THIN FILM LIGHT SOURCE ARRANGED LIGHT RECEIVING ELEMENTS AND IMAGE TO BE SENSED

BACKGROUND OF THE INVENTION

1. Field of the Invention

The present invention relates to an image sensor device, more particularly to an image sensor device of fully contact type which is installed in an image input device such as a facsimile or a hand-held scanner.

2. Description of the Related Art

As an image sensor device, there have heretofore been image sensors of the fully contact type which are installed in a small sized image input device such as a facsimile or a hand-held scanner, and various structures of image input devices have been known. Among these image sensors, a thin film light source of plane radiation type has been used as means for further achieving a reduction in a size of the image sensor devices. For the image sensor device using such thin film light source, various structures have been known. Such a typical image sensor device will be described below.

Japanese Patent No. Showa 59-41629 discloses a first conventional example in which an image sensor is used. FIG. 1 is a perspective view showing a configuration of an image sensor device of the first conventional example.

The image sensor device consists of an optical fiber collection member 1201 composed of a plurality of bundled optical fibers 1202; an illumination unit 1204 utilizing electroluminescence (EL); photoelectric conversion elements 1203 utilizing a thin film semiconductor such as amorphous silicon (a-Si); and a light blocking unit 1205. In FIG. 1, although only three photoelectric conversion elements 1203 are shown, actually the photoelectric conversion elements 1203 of such structures are sequentially arranged in a arrangement direction. The number of the photoelectric conversion elements ranges from several hundreds to several thousands.

Next, an operation of the image sensor device will be described. Light emitted uniformly from the illumination unit 1204 travels through the optical fibers 1202 to reach a document 1290. The reflected light from the document 1290 partially travels through the inside of the document and a small gap between the document and the optical fiber collection member 1201, and passes through the inside of the optical fiber 1202. This reflected light is detected by the photoelectric conversion element 1203. Brightness information for one line of the document can be obtained from an output from the plurality of photoelectric conversion elements arranged on a line. By recording the information while continually moving the document in parallel, reading out for the document is conducted. If the light from the illumination unit 1204 is incident on the photoelectric conversion 1203, contrast of the image read out from the document is deteriorated. This is prevented by the light blocking unit 1205 which prevents light from being directly incident on the photoelectric conversion element 1203. Moreover, the optical fiber collection member 1201 also functions as a supporter for the photoelectric conversion element 1204 formed by thin film processes.

Japanese Patent Laid Open No. Heisei 7-58910 discloses a second conventional example in which an image sensor such as a CCD and a MOS type sensor, formed of crystalline silicon, is used. FIG. 2 is a section view showing a configuration of an image sensor device of the second conventional example.

This image sensor device is constructed such, that on a supporting body in which optical fiber array 1301 is sandwiched between opaque glass substrate 1302 and transparent glass substrate 1303, an image sensor chip 1305 such a CCD is mounted interposed by adhesion layer 1309 in such a way that light receiving element array 1306 faces the document. At this time, the image sensor chip 1305 is electrically coupled to an external circuit (not shown) by a circuit conductive layer 1308, formed on the opaque glass substrate 1302, and an electrode 1307. Moreover, an illumination unit 1310 utilizing electroluminescence (EL) is arranged, close to the light receiving element array 1306, on an upper portion of the transparent glass plate 1303. A light blocking layer 1304 is provided on the surface of the transparent glass substrate 1303 on the document side.

Next, an operation of the image sensor device of the second conventional example will be described. Light emitted from the illumination unit 1310 passes through the transparent glass plate 1303 to be incident on the side surface of the optical fiber array 1301. The light illuminates the document 1390 located at the place facing the light receiving element array 1306. The reflected light from the document passes through the optical fiber array 1301 so that it is detected by the light receiving element 1306.

The two conventional examples described above use the optical fiber collection member. A conventional example using no optical fiber collection member will be described as a third conventional example. The third conventional example is an image sensor device disclosed in Japanese Patent Application Laid Open No. Showa 62-27975. FIG. 3 is a sectional view showing a configuration of the image sensor device of the third example.

The image sensor device of the third conventional example is constituted such that a sensor section 1410 and an illumination section 1420 are formed in parallel on a glass substrate 1401, both being close to each other. The sensor section 1410 is constituted by arranging an a-Si layer 1403 between a bottom electrode 1402 and a transparent electrode 1404 and the illumination section 1420 is constituted by arranging an EL element 1406 formed of a thin film between an electrode 1405 and a transparent electrode 1407.

Next, an operation of the image sensor device of the third conventional example will be described. Light emitted from the illumination section 1420 toward a document 1490 passes through a protection layer 1408 to irradiate the document 1490. The reflected light from the document 1490 is partially detected by the sensor section 1410, thereby obtaining brightness information of the document 1490.

The conventional examples explained above have the constitution that the illumination section and the sensor section are arranged close to each other on the same plane. A conventional example in which both illumination and sensor sections are stacked will be shown as a fourth conventional example. The fourth conventional example is an image sensor device disclosed in Japanese Patent Application No. Heisei 5-344280. FIG. 4 is a sectional view showing the constitution of the image sensor device of the fourth conventional example.

The image sensor device of the fourth conventional example is constituted by stacking a transparent substrate 1501 having a light receiving element array 1502 formed therein and a transparent substrate 1503 having a dispersion-type EL element 1504 formed therein interposed by an adhesive layer 1511, the dispersion-type EL element 1504 being composed of a transparent electrode 1505, a light emission layer 1506, an insulation layer 1507 and an opaque electrode 1508. In the dispersion-type EL element 1504, a light transmission window 1510 is formed corresponding to the light receiving element array 1502. Since the light from the dispersion-type EL element 1504 should not be directly incident on the light receiving element array 1502, a light emission section is covered with a frame portion 1509 and the opaque electrode 1508.

Next, an operation of the image sensor device of the fourth conventional example will be described. The light emitted from the light emission layer 1506 passes through the transparent substrate 1503 to illuminate a document 1590. The reflected light from the document 1590 partially passes through the light transmission window 1510. The light having passed through the light transmission window 1510 is detected by the light receiving element array 1502, whereby information as to brightness of the document can be obtained.

By combining the conventional components of the conventional examples described above, specifically, according to usage of either the dispersion-type EL element or the thin film EL element for the light source, usage of either the sensor formed of crystalline silicon such as CCD or the sensor formed of a thin film semiconductor such as the a-Si for the image sensor, and formation by either parallel arrangement of the light source section and the sensor section or stacking of them, many types of constitutions by combination can be available.

With progress of development of an organic EL light source, the organic EL light source possesses more advantageous features for being mounted on the image sensor device because it is formed to be thinner, has higher brightness and capable of being driven by lower voltage than the dispersion-type EL light source. FIG. 5 is a exploded perspective view showing an example of the image sensor device inferred from the above described conventional examples.

The image sensor device of FIG. 5 is constituted by combining an image sensor 1610 and a thin film light source 1620, the image sensor 1610 having the structure in which a plurality of photoelectric conversion elements 1612 are uniformly arranged on an image sensor substrate 1611 and the thin film light source 1620 having the structure in which a transparent electrode 1622 is formed on a transparent substrate 1621, a light emission layer 1623 is formed on the transparent electrode 1622, and an opaque electrode 1624 having a plurality of opening portions 1625 formed corresponding to the photoelectric conversion elements 1612 is formed on the transparent substrate 1621.

FIG. 6A and FIG. 6B are drawings for explaining the image sensor device in detail. FIG. 6A is a sectional view of a plane including the opening portion 1625 and the transparent electrode 1622, and FIG. 6B is a bottom view when the thin film light source 1620 and the image sensor 1610 are viewed from the document. As is shown in FIG. 6A, the light emission layer 1623 and the photoelectric conversion element 1612 are arranged in parallel in close proximity and stacked with adhesive layer 1630 interposed between them. Moreover, as is shown in FIG. 6B, the light incident on the surface of the image sensor 1610 facing the thin film light source 1620 is shaded by the opaque electrode 1624 except for the center portion of the photoelectric conversion element 1612. Here, although for simplicity of explanation the light emission layer 1623 formed of the organic EL element was described as a conventional component of the thin film light source 1620, a device structure which is constituted by stacking more than two kinds of organic thin films has been known as the light emission layer, as is commented in literature, for example, "organic light emission device", O Plus E, March 1996, pp. 70–75. These devices possess sufficient light emission intensity to be mounted on the image sensor.

Next, an operation of this example will be described. Light emitted from the light emission layer 1623 passes through the transparent substrate 1621 to illuminate a document 1690. The reflected light from the document 1690 partially passes through the transparent substrate 1621 and the opening portion 1625 and is detected by the photoelectric conversion element 1612, whereby information as to brightness of the document can be obtained.

In the conventional image sensor device using the thin film light source, it is difficult to input an image thereinto with a high resolution. Moreover, since a power consumption of the light source can not be decreased, it is difficult to install the image sensor device into a portable equipment. The reason for this will be described below.

In general, the thin film light source of surface light emission type possesses the directivity that it radiates light with the maximum intensity toward the vertical direction and radiates light with lower intensity as an angle with respect to the vertical direction increases. Therefore, the portion in the document facing the light emission section of the thin film light source is illuminated most strongly, and the periphery of that portion is illuminated with lower intensity. Moreover, since the reflected light from the document is in general diffused light, the light is reflected toward various directions. Among the light reflected, only the light reflected toward the photoelectric conversion element is alone detected. Therefore, the closer the portion of the document is to the photoelectric conversion element, the higher the probability of the reflected light being incident on the photoelectric conversion element.

Therefore, in the conventional example using no optical fiber collection member, an output from the photoelectric conversion element will reflects brightness information for a portion of the document, such as from the portion facing the illumination section to the periphery around that portion, and the portion facing the photoelectric conversion element to the periphery around that portion. With such circumstances it is impossible to input an image with a high resolution.

In the conventional examples of FIGS. 1 and 2 using the optical fiber collection member, the reflected light from the portion other than that of the document facing the photoelectric conversion element is excluded. Specifically, the reflected light from the place facing the illumination section capable of performing illumination with most effectiveness can not be utilized. Moreover, also in the conventional example using no optical fiber collection member, the light emitted from the thin film light source is reflected by the document so that the proportion of the light incident on the photoelectric conversion element is small. Specifically, a large majority of emitted light is wasted. Since a signal of sufficient quantity can not be obtained under such circumstances, measures to increase the quantity of light emission from the light source such as an enlargement of an area of the light emission section or an increase in a voltage to be applied to the EL element are taken. Since such actions result in increasing the power consumption of the light source, it is not compatible with the aim to manufacture a small sized image sensor device nor for installing an image sensor device into a portable equipment. Moreover, if the area of the light emission section is widened, the resolution of the device is deteriorated from the foregoing reasons.

As described above, the image sensor device utilizing the conventional thin film light source has no ability to input the image with a high resolution. Furthermore, since the utilization efficiency of the light is low, the power consumption of the light source can not be reduced.

In order to improve the image quality of the image sensor device and the utilization efficiency of light, only the portion of the document to be read should be illuminated and the light reflected from other portion should as far as possible be excluded.

SUMMARY OF THE INVENTION

The object of the present invention is to eliminate the drawbacks of the prior art by providing an image sensor device which is capable of reading out a document with a high resolution, reducing a power consumption of a light source and capable of being advantageously installed into portable equipment.

An image sensor device of the present invention, which optically reads out a document, comprises an image sensor portion having a plurality of light receiving elements arranged regularly, each of which faces a document to be read out; and a thin film light source arranged tightly contacted on the document side of the image sensor portion, the thin film light source emitting light toward the document. The thin film light source has more than one light emission portion corresponding to each of the light receiving elements, the light emission portion having an area smaller than that of the light receiving element, and the light emission portion has a light blocking layer on the light receiving element side, and is arranged on a lower surface of the light receiving element between the light receiving element and the document.

Furthermore, the thin film light source may comprise light emission portion having an area larger than that of the light receiving element corresponding to each of the light receiving elements, the light emission portion may have light blocking layers on the light receiving element side, and the light blocking layer may have more than one opening portion for transmitting the light from the document to the light receiving element.

Furthermore, in order to irradiate the light emitted from the thin film light source onto only a specific portion of the document, a light absorption unit may be disposed at a portion other than the document irradiation portion between the light emission portion and the document. A reflection mirror and a dielectric mirror may be integrally formed as a conventional component of the thin film light source, which are interposed by the light emission portion of the thin film light source. An optical fiber collection member for converting the light to parallel light may be disposed between the light emission portion and the document.

Moreover, an optical fiber collection member (for converting the light to parallel light) may be disposed between the light emission portion and the document and optical means for bending the course of the light to the predetermined direction may be disposed between the optical fiber collection member and the document. This optical means should be any of a diffraction grating, a micro lens and a V-shaped groove.

Moreover, a light guiding means may be provided for guiding the light emitted by the thin film light source to either one light receiving element or to specified light receiving elements among the plurality of light receiving elements, as well as adjusting means for adjusting the sensitivity of the image sensor section depending on a signal output detected by the specified light receiving element. The light guiding means may be a light reflection layer disposed between the thin film light source and the document.

The light emission portion of the thin film light source may be composed of a transparent electrode an opaque electrode and an organic thin film held between the transparent and opaque electrode, and the opaque electrode may be formed of a material functioning as a light blocking layer for the region except for the light receiving element of-the image sensor portion. Light blocking means may be disposed at a region other than the light receiving element of the image sensor portion. The image sensor portion may be either an image sensor formed on a silicon wafer or an image sensor formed on the transparent substrate by thin film semiconductor processes. The thin film light source may emit lights of a plurality of different colors, and an optical fiber collection member may be provided between the thin film light source and the document.

The light emission section of the thin film light source having an area smaller than that of the light receiving element is disposed on the lower surface of the light receiving element, and the opening portion is disposed at the light emission section having an area larger than that of the light receiving element provided on the lower surface of the light receiving element, whereby the light which is incident onto the narrow portion of the document at the lower portion of the light emission portion is reflected to be incident onto the light receiving element right above the document, resolution of the light receiving element is increased, and the power consumption of the light source can be reduced.

By absorbing light for other than the necessary portion by the light absorption unit, by changing the light beam to a parallel light by the reflection mirror and the dielectric mirror which are integrated together, by changing the light beam to a parallel beam by the optical fiber collection member, and by bending the course of the light beam, which is made parallel by the optical fiber, by optical means the light is concentrated to the predetermined place corresponding to the light receiving element. Thus, the reflected light from a small area is incident onto the light receiving element, thereby increasing resolution of the light receiving element.

The light emitted from the light source is guided to the specified light receiving element by the light guiding means, and the sensitivity of the image sensor is adjusted depending on the signal output detected, whereby the image sensor performs a stable operation.

By preparing the opaque electrode contacting the organic thin film from a material possessing light blocking property, it will be unnecessary to provide a separate light blocking layer.

By combining light sources emitting different colors, color image input with a high sensitivity can be realized without a color filter.

By arranging the optical fiber collection member between the thin film light source and the document, a function as a supporter for the image sensor can be obtained, as well as a function to protect other structural members.

The above and other object, features, and advantages of the present invention will become apparent from the following description based on the accompanying drawings which illustrate an example of a preferred embodiment of the present invention.

BRIEF DESCRIPTION OF THE DRAWINGS

FIG. 12 is a sectional view showing a structure of an image sensor device of a fifth embodiment of the present invention.

FIG. 13 is a sectional view showing a structure of an image sensor device of a sixth embodiment of the present invention.

DETAILED DESCRIPTION OF THE PREFERRED EMBODIMENTS

Figure 7:
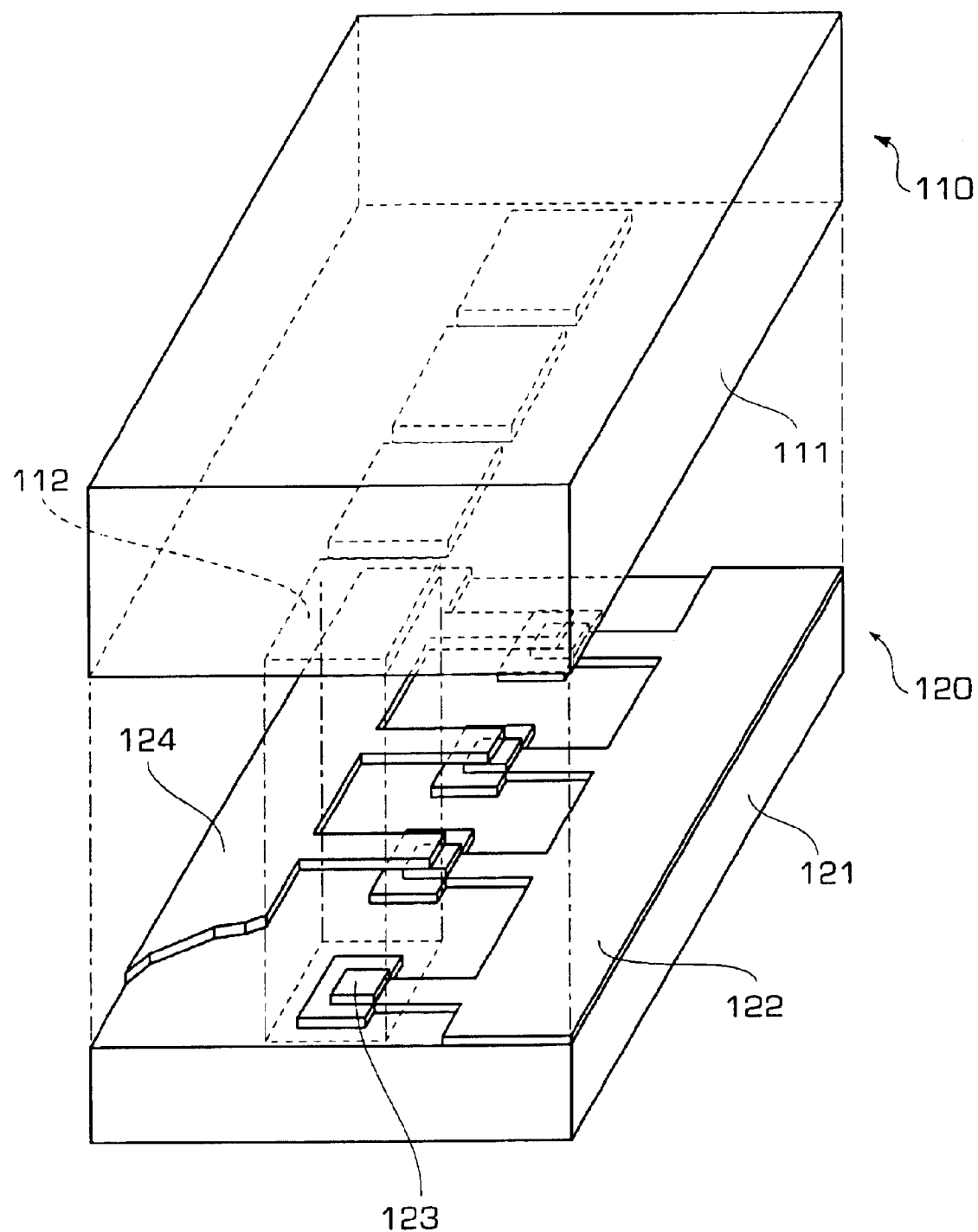
FIG. 7 is an exploded perspective view showing a constitution of an image sensor device of a first embodiment.

A first embodiment of the present invention will be described with reference to FIGS. 7 and 8. FIG. 7 is an exploded perspective view showing a constitution of an image sensor used as an image input device such as a facsimile or a hand-held scanner, shown in the first embodiment.

Figure 8A:
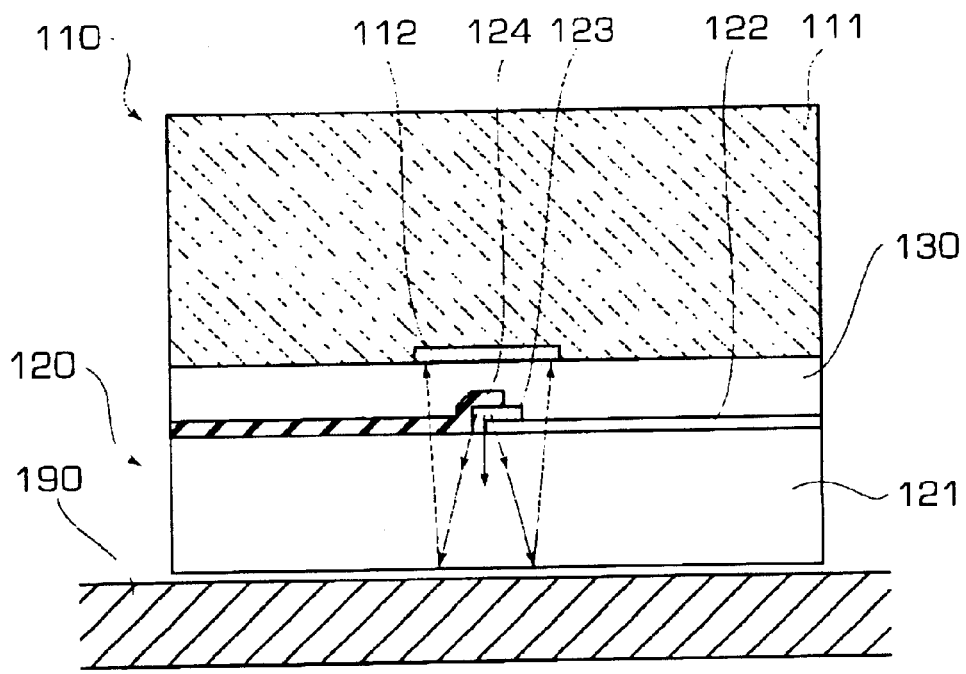
FIG. 8A is an explanatory view showing the image sensor device of FIG. 7 in detail, and a sectional view of a plane including a light emission layer, a transparent electrode and an opaque electrode.
Figure 8B:
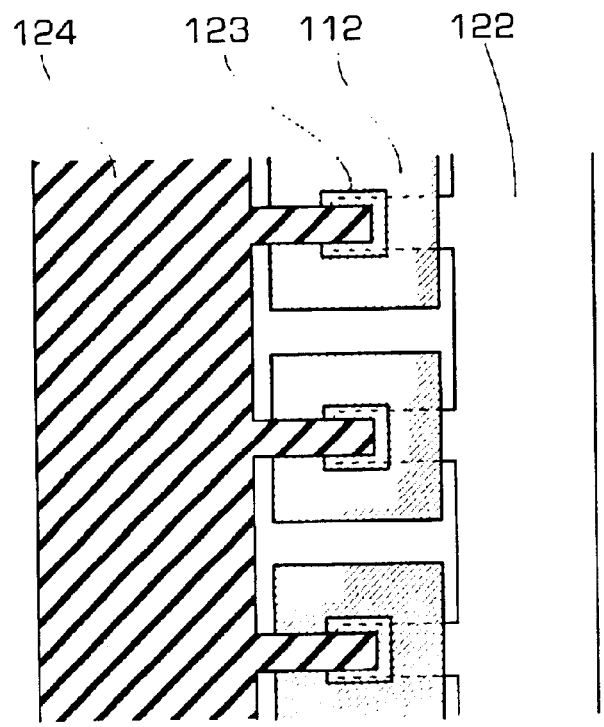
FIG. 8B is an explanatory view showing the image sensor device of FIG. 7 in detail, and a bottom surface view when a thin film light source and an image sensor are viewed from a document side.

This image sensor device is constituted by a combination of an image sensor 110 in which a plurality of photoelectric conversion elements 112 are arranged regularly on an image sensor substrate 111 with a thin film light source 120. Here, the image sensor 110 may be one such as a CCD or a MOS type sensor, formed on a crystalline silicon wafer. Or else, the image sensor 110 may be one such as amorphous silicon, formed on an insulating substrate by means of thin film semiconductor processes. Moreover, the thin film light source 120 is constituted in the following order. Specifically, first, corresponding to the center of a photoelectric conversion element 112, a comb-tooth shaped transparent electrode 122 is formed of an oxide material such as InSn on a transparent substrate 121; secondly, a light emission layer 123 formed of an organic EL film is formed on a comb-shaped projection portion; and thirdly, an opaque electrode 124 formed of an opaque material such as aluminum is formed on the light emission layer 123. The two electrodes are insulated by the light emission layer 123. FIG. 8A is an explanatory view of the image sensor device of FIG. 7 showing it in detail. Specifically, FIG. 8A is a sectional view of a plane including the light emission layer 123, the transparent electrode 122 and the opaque electrode 124. FIG. 8B is a bottom surface view showing an appearance when the thin film light source 120 and the image sensor 110 are viewed from the document side. As shown in FIG. 8A, the thin film light source 120 and the image sensor 110 are stacked interposed by an adhesive layer 130 so as to dispose the light emission layer 123 at the center of the photoelectric conversion element 112. Here, to show some numerical examples, for an image sensor of for example 200 dpi, a pitch of the photoelectric conversion element 112 is 125 microns. An area of the photoelectric conversion element 112 is about 100×100 microns. An area of the light emission section in the light emission layer 123 is determined by considering the quantity of light emission and the sensitivity of the image sensor 110. For a distance in a thickness direction, the transparent substrate 121 is set to be about 50 microns, and the adhesive layer 130 is set to be less than several microns. Moreover, the thickness of the electrodes 122 and 124 of the thin film light source 121 and the light emission layer 123 is 1 micron or less in total. The thickness of the image sensor 110 ranges from several hundred microns to at least about 1 mm. Therefore, the image sensor having the thickness of about 1 mm in total, which is very small in size, can be obtained.

An image reading-out operation of this embodiment described above will be explained. The portion of the light emission layer 123 between the transparent electrode 122 and the opaque electrode 124 alone emits light. Specifically, as shown in FIG. 8B, in this embodiment, the light emission portion of the thin film light source 120 is limited to the place facing the center of the photoelectric conversion element 112. The light emitted from these light emission portions passes through the transparent substrate 121 to illuminate limitedly the portion of the document 190 closest to the corresponding photoelectric conversion element. The reflected light from the document 190 passes through the transparent substrate 121 and detected by the photoelectric conversion element 112 corresponding to this light emission portion, whereby information as to brightness of the document can be obtained. In this embodiment, the photoelectric conversion elements 112 detecting the reflected lights from the document and the light emission portion, respectively, correspond to each other. However, one photoelectric conversion element may correspond to the plurality of light emission portions. Moreover, the portion of the document 190 which is illuminated most strongly almost agrees with the portion of the document 190 facing the photoelectric conversion element 112.

As described above, in this embodiment, the portion of the document to be read out is limitedly illuminated, whereby the photoelectric conversion device disposed closest to that portion can detect the reflected light effectively. Therefore, by installing the image sensor device shown in this embodiment into an image reading-out device and the like, it will be possible to read out the image with a high resolution. Moreover, since the probability of incidence of the reflected light onto the photoelectric conversion element is high, the quantity of light emission of the light source can be reduced and the power consumption can be suppressed to be little.

Figure 9A:
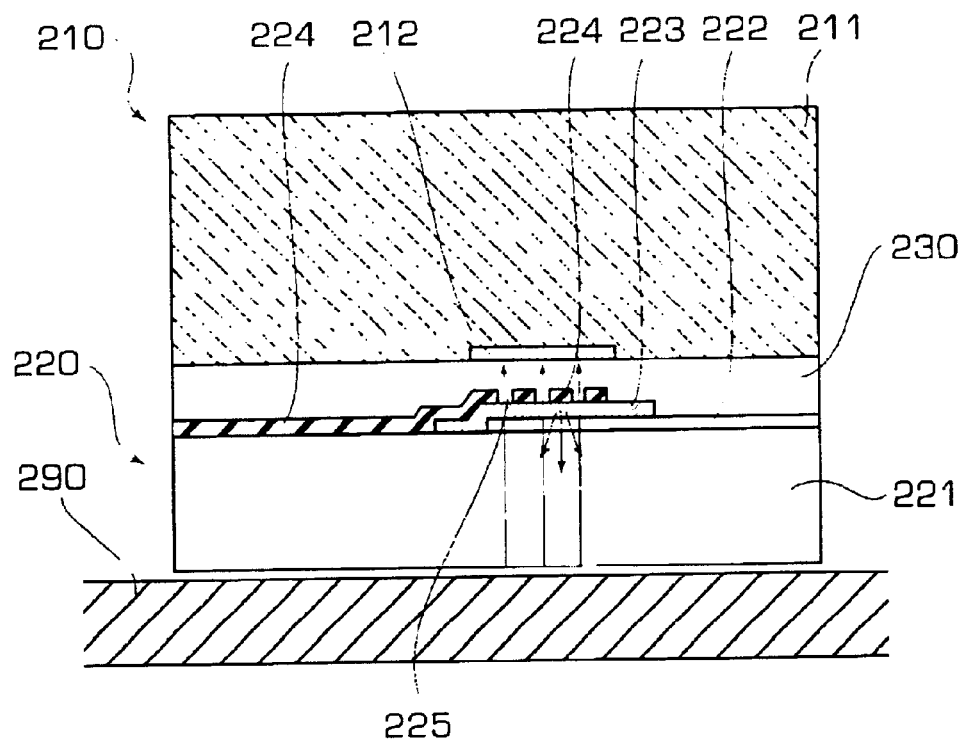
FIG. 9A is an explanatory view showing an image sensor device of a second embodiment in detail, and a sectional view of a plane including a light emission layer, a transparent electrode and an opaque electrode.
Figure 9B:
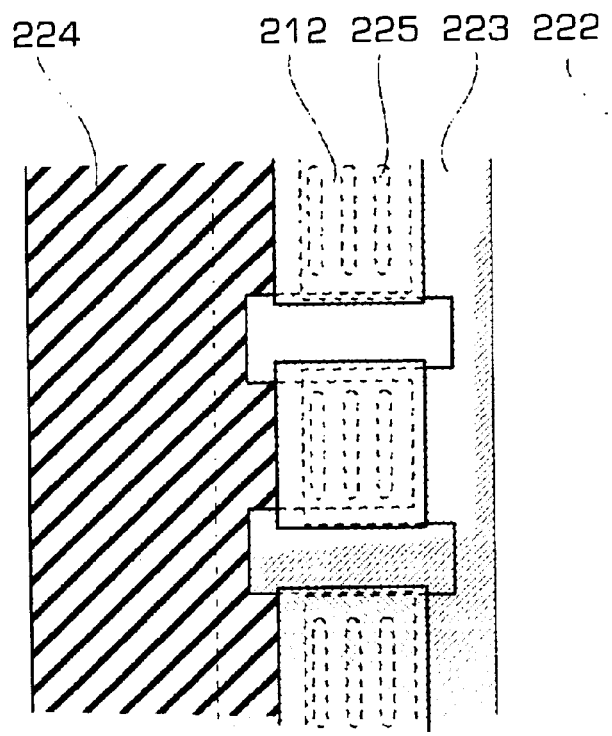
FIG. 9B is an explanatory view showing the image sensor device of the second embodiment in detail, and a bottom surface view when a thin film light source and an image sensor are viewed from a document side.

It should be noted that although the shape of the light emission portion of this embodiment is rectangular, for example, circular or polygonal light emission portion can achieve similar effects. The present invention gives no limitation to the detailed shape of the light emission portion. For example, an opening may be provided in the light emission portion and the light emission portion may be disposed so that the entire surface of the photoelectric conversion element corresponding to it is covered. Such a second embodiment of the present invention will be shown in FIGS. 9A and 9B. FIG. 9A is an explanatory view showing an image sensor device of the second embodiment in detail, and FIG. 9A is a sectional view of a plane including a light emission layer 223, a transparent electrode 222 and an opaque electrode 224. FIG. 9B is a lower surface view of the device showing an appearance when a thin film light source 220 and an image sensor 210 are viewed from a document side.

The transparent electrode 222 of this thin film light source 220 has a projected portion in almost the same shape as that of the photoelectric conversion element 212. The light emission layer 223 has a width equal to that of the photoelectric conversion element 212 or more. The opaque electrode 224 has a projected portion having almost the same shape as that of the photoelectric conversion element 212, and comprises a plurality of rectangular opening portions 225.

Next, a image reading-out operation of the embodiment constituted as above will be described. The portion of the light emission layer 223 between the transparent electrode 222 and the opaque electrode 224 serves as a light emission portion. The light emitted from the light emission portion passes through the transparent substrate 221, and illuminates the portion of the document 290 closest thereto. The reflected light from that portion of the document 290 passes through the transparent substrate 221 and the opening portion 225 of the opaque electrode 224 to be detected by the photoelectric conversion element 212. An area of the opening portion 225 is determined by considering the intensity of the light emission of the light source and the sensitivity of the image sensor 210. The effects of this embodiment are the same as those of the first embodiment.

Figure 6A:
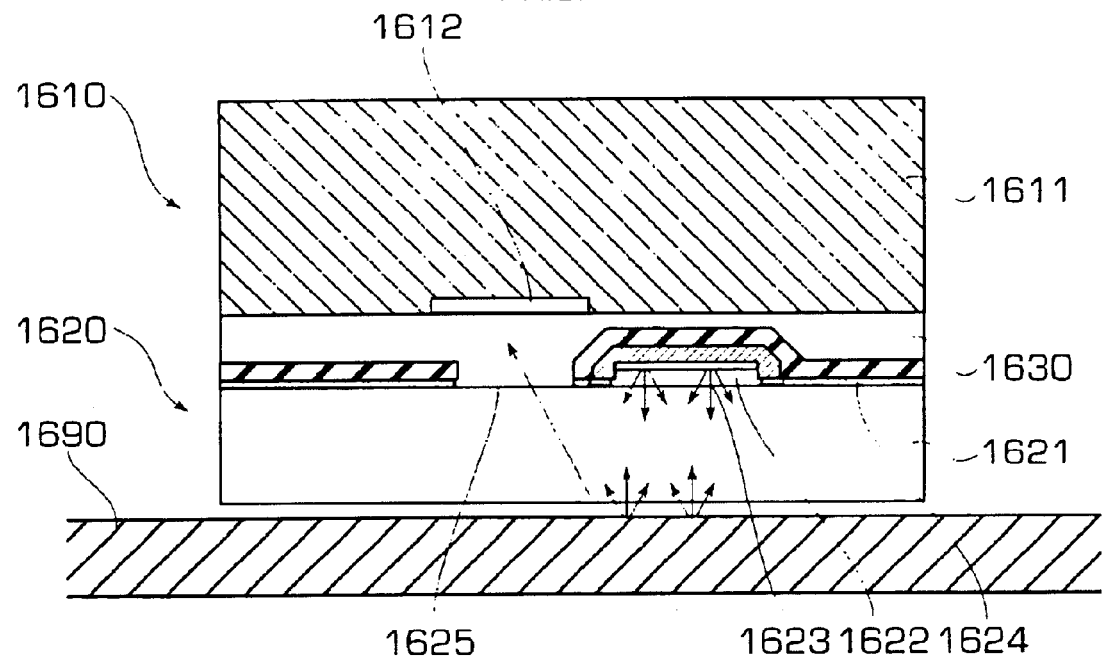
FIG. 6A is an explanatory view showing the image sensor device of FIG. 5 in detail, and a sectional view of a plane including an opening portion and a transparent electrode.
Figure 10:
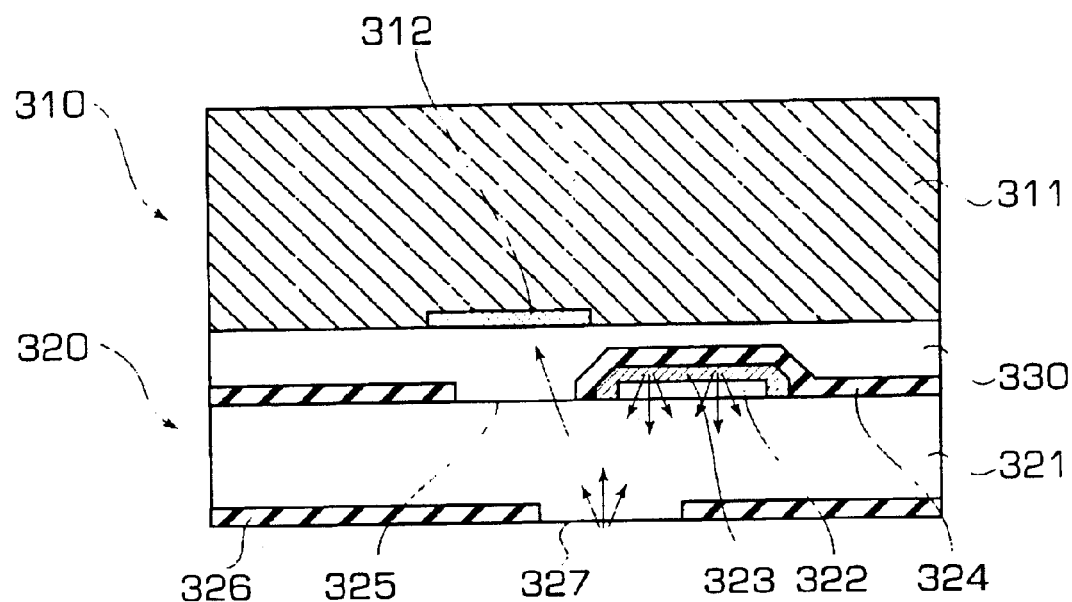
FIG. 10 is a sectional view showing a structure of an image sensor device of a third embodiment of the present invention.

FIG. 10 is a sectional view showing a structure of an image sensor device of a third embodiment of the present invention. The image sensor device of the third embodiment comprises a light absorption layer 326 on the surface of the document side of the transparent substrate 321, in addition to the conventional components of the conventional example of FIG. 6A. The light absorption layer 326 has an opening portion 327 corresponding to the shape of the photoelectric conversion element 312, and the opening portion 327 is formed by ordinary photograph steps such as photolithograpy using a resist to which black paint is mixed.

Figure 1:
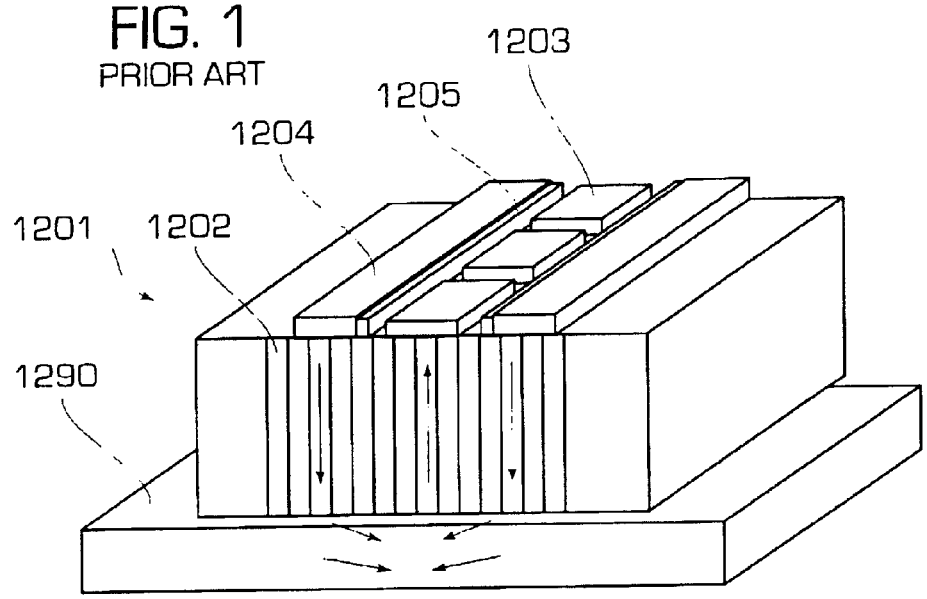
FIG. 1 is a perspective view showing a constitution of a first conventional image sensor.
Figure 2:
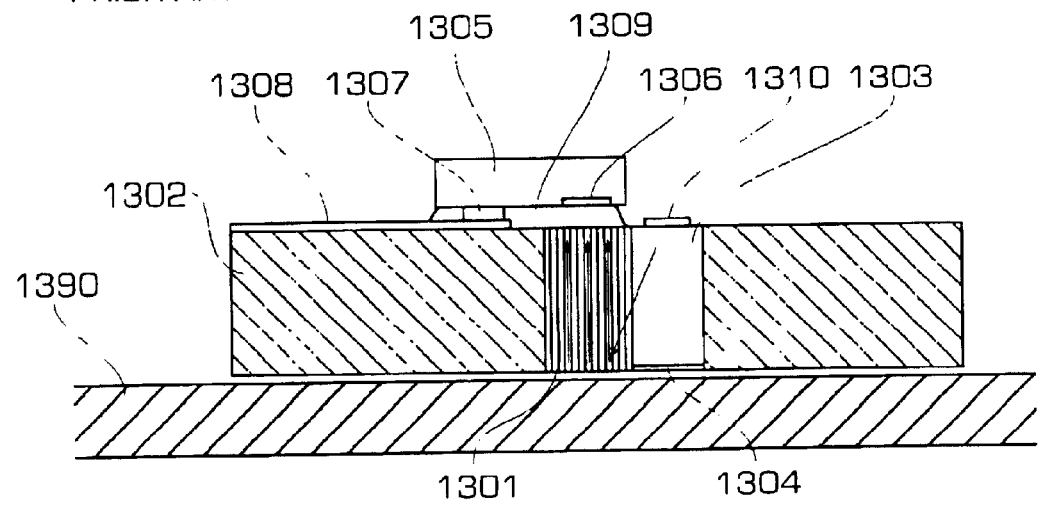
FIG. 2 is a sectional view showing a constitution of a second conventional image sensor.
Figure 3:
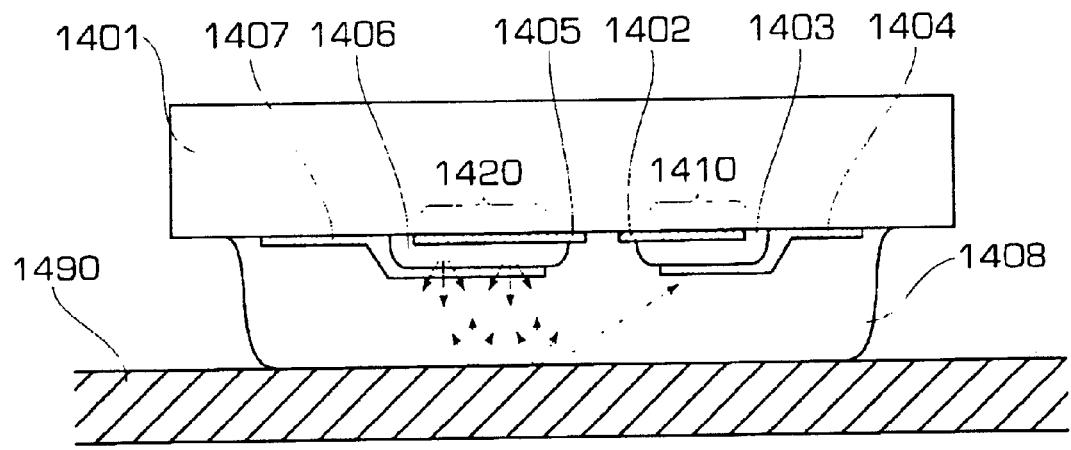
FIG. 3 is a sectional view showing a constitution of a third conventional image sensor.
Figure 4:
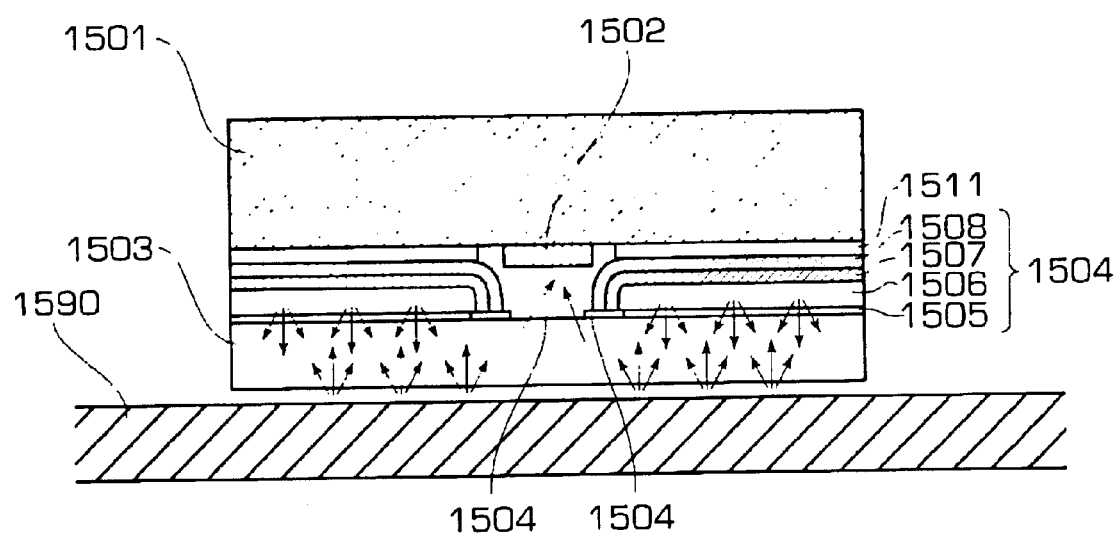
FIG. 4 is a sectional view showing a constitution of a fourth conventional image sensor.
Figure 5:
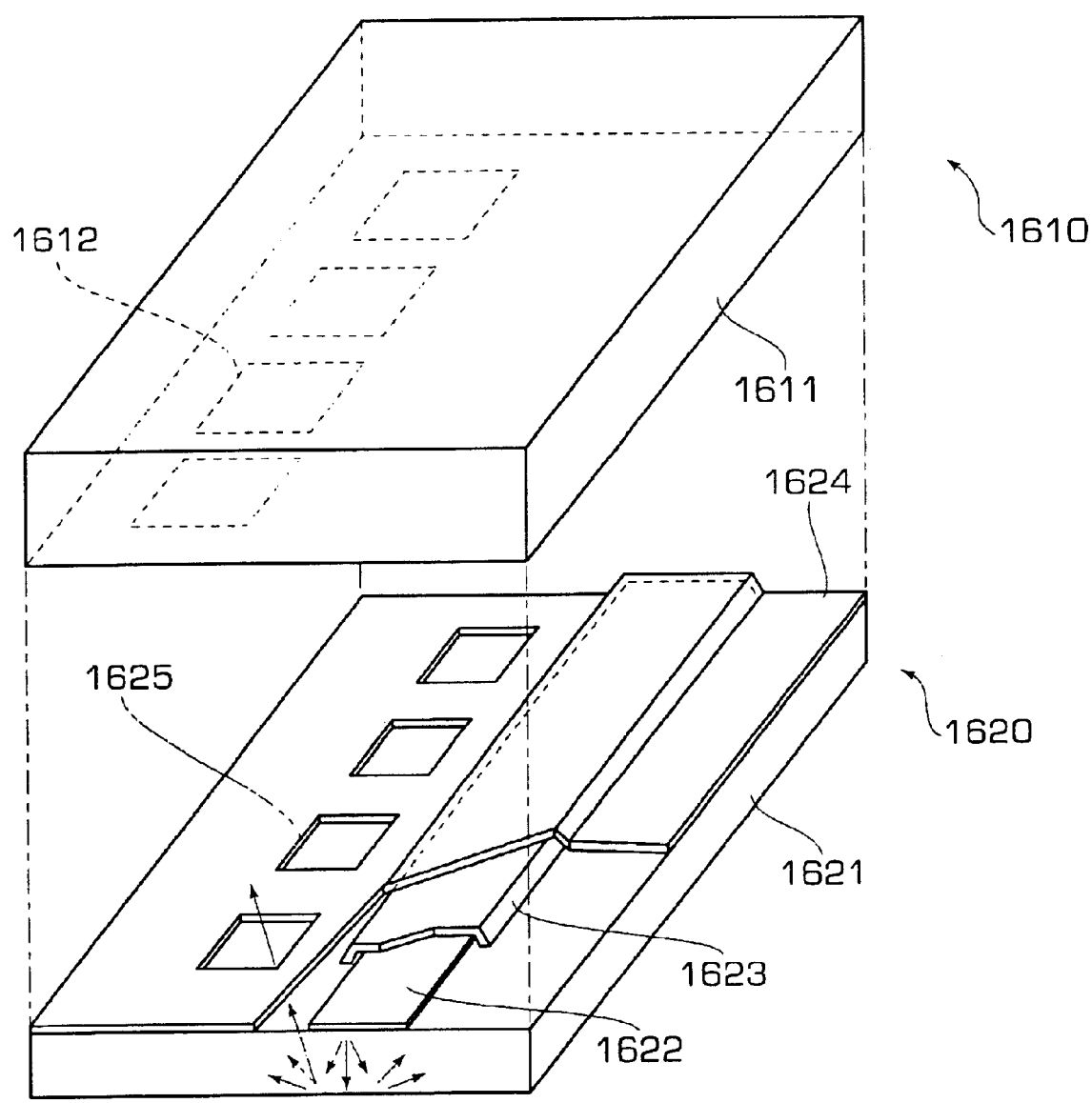
FIG. 5 is an exploded perspective view showing an example of an image sensor device inferred from the conventional examples.
Figure 6B:
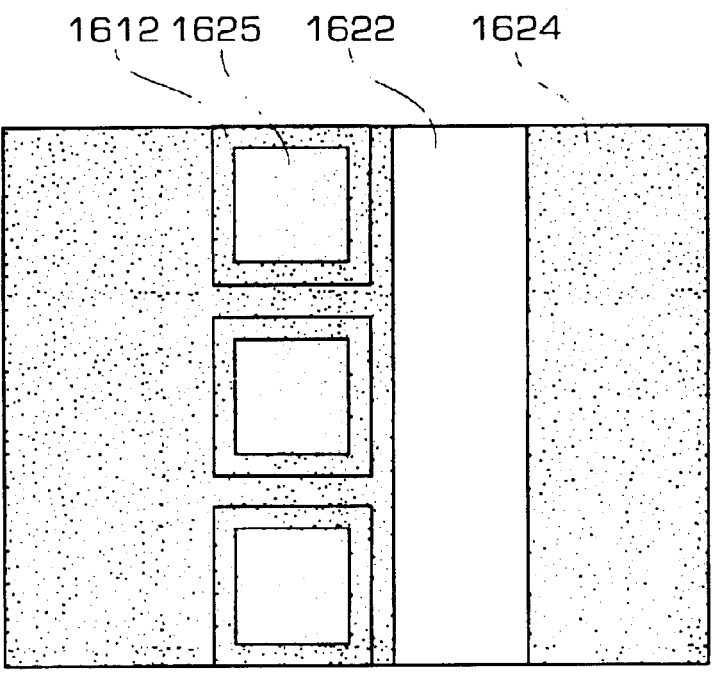
FIG. 6B is an explanatory view showing the image sensor device of FIG. 5 in detail, and a bottom surface view when a thin film light source and an image sensor are viewed from a document side.

Next, an operation of the device of this embodiment will be described. The light emitted from the light emission layer 323 with a certain directivity illuminates limitedly the portion of the document corresponding to the opening portion 327. The reflected light from the document partially passes through the opening portion 325 and detected by the photoelectric conversion element 312. Also in this embodiment, since the document is partially illuminated, it is possible to input the image with a high resolution. It should be noted that the utilization efficiency is the same as those of the conventional examples in FIGS. 5 and 6.

Figure 11:
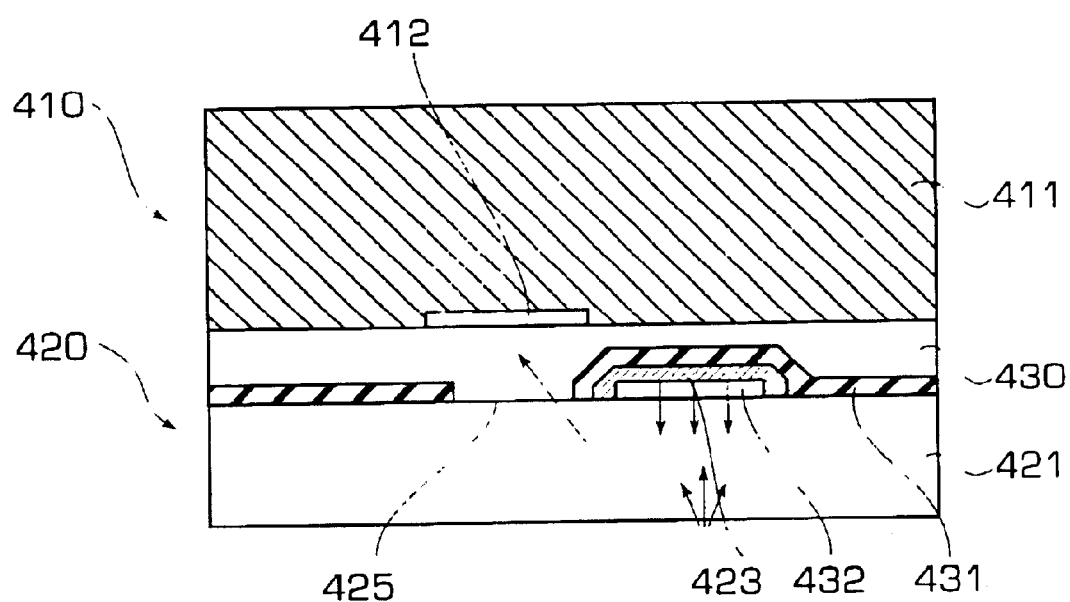
FIG. 11 is a sectional view showing a structure of an image sensor device of a fourth embodiment of the present invention.

FIG. 11 is a sectional view showing the structure of an image sensor device of a fourth embodiment of the present invention. The feature of the image sensor device of this embodiment is that a thin film light source 420 emits a beam of light similar to a parallel beam of light. As such beam of light was reported in the document "Strong Directivity Light Emission from Small Optical Resonator Type Organic EL Device", (Collected Materials of Spring Conference, 1996, Applied Physic Society, 27a-SY-30), it has been known that the image sensor device can be formed by producing a resonator structure in which a transparent electrode functions as a dielectric mirror and an opaque electrode functions as a reflection mirror, in a structure in which an organic thin film is held between the transparent electrode and the opaque electrode.

In FIG. 11, a thin film light source 420 consists of a dielectric mirror 432 serving also as a transparent electrode, a light emission layer 423 formed of an organic thin film and a reflection mirror 431 serving also as a opaque electrode.

Next, an operation of the thin film light source of FIG. 11 will be described. Parallel light emitted from the light emission layer 423 limitedly illuminates the portion of a document facing the light emission layer 423. The part of the reflected light from the document which passes through the opening portion 425 is detected by the photoelectric conversion element 412. Also in this embodiment, since the document is partially illumintated limitedly, it is possible to input the image with a high resolution. It should be noted that the device of FIG. 11 is the same as the conventional examples of FIGS. 5 and 6, as to the utilization efficiecy of light.

FIG. 12 is a sectional view showing the structure of an image sensor of a fifth embodiment. For the conventional example of FIG. 6A, the image sensor of FIG. 12 has a feature that a thin film light source 520 composed of a transparent electrode 522, a light emission layer 523 and an opaque electrode 524 is formed on an optical fiber collection member 540, and a transparent substrate 561 is inserted between a document and the optical fiber collection member 540. Here, the optical fiber collection member 540 is constituted by combining an optical fiber 541 of a small numerical aperture and an optical fiber 542 of a large numerical aperture, the optical fiber 541 being arranged so as to face the light emission layer 523 and the optical fiber 542 being arranged so as to face the photoelectric conversion element 512. Since the distance in a thickness direction for the optical fiber collection member 540 and the image sensor 510 is less than 1 mm and at least about 50 microns for the transparent substrate 561, the distance is less than 2 mm in total.

Next, an operation of the image sensor of FIG. 12 will be described. The light emitted from light emission layer 523, arranged in such a way that each of an element light with an angle of incident greater than that decided by the numerical aperture of the optical fiber 541, is either absorbed by a wall of the optical fiber or leaks to the outside, so that the light is not transmitted through the optical fiber. As a result, the light transmitted through the optical fiber 541 is only the light incident at an incidence angle less than a predetermined angle. Therefore, by selecting an optical fiber of a sufficiently small numerical aperture, the beam of light similar to parallel beam of light can be produced, and the beam of light similar to parallel beam of light limitedly illuminates the part of the document facing the light emission portion. The light reflected by the document is partially transmitted through the optical fiber 542, and detected by the photoelectric conversion element 512. Also in this embodiment, since the part of the document is limitedly illuminated, it is possible to input the image with a high resolution. It should be noted that as to the utilization of light, the image sensor of this embodiment is the same as the conventional examples of FIGS. 5 and 6.

FIG. 13 is a sectional view showing the structure of an image sensor of a sixth embodiment of the present invention. The image sensor of this embodiment has a feature that instead of the transparent substrate 221 of the second embodiment of the present invention shown in FIG. 9A, a thin film light source composed of a transparent electrode 622, a light emission layer 623 and an opaque electrode 624 is formed on an optical fiber collection member 640. Here, since illumination for a document and transmitting of reflected light are conducted by the same optical fiber 643, the same effects as those of the second embodiment of the present invention of FIG. 9 can be obtained, also in this embodiment. In addition, since the optical fiber collection member 640 functions as a supporter for the image sensor 610, there is also a merit that the number of parts concerning the supporter can be reduced when the image sensor device of the present invention is installed into an image input device such as a facsimile and hand-held scanner. Moreover, since the optical fiber collection member 640 functions as a protection member for other conventional members, the image sensor device of this embodiment has a strong resistance to damages from a surface contacting with the document.

Figure 14:
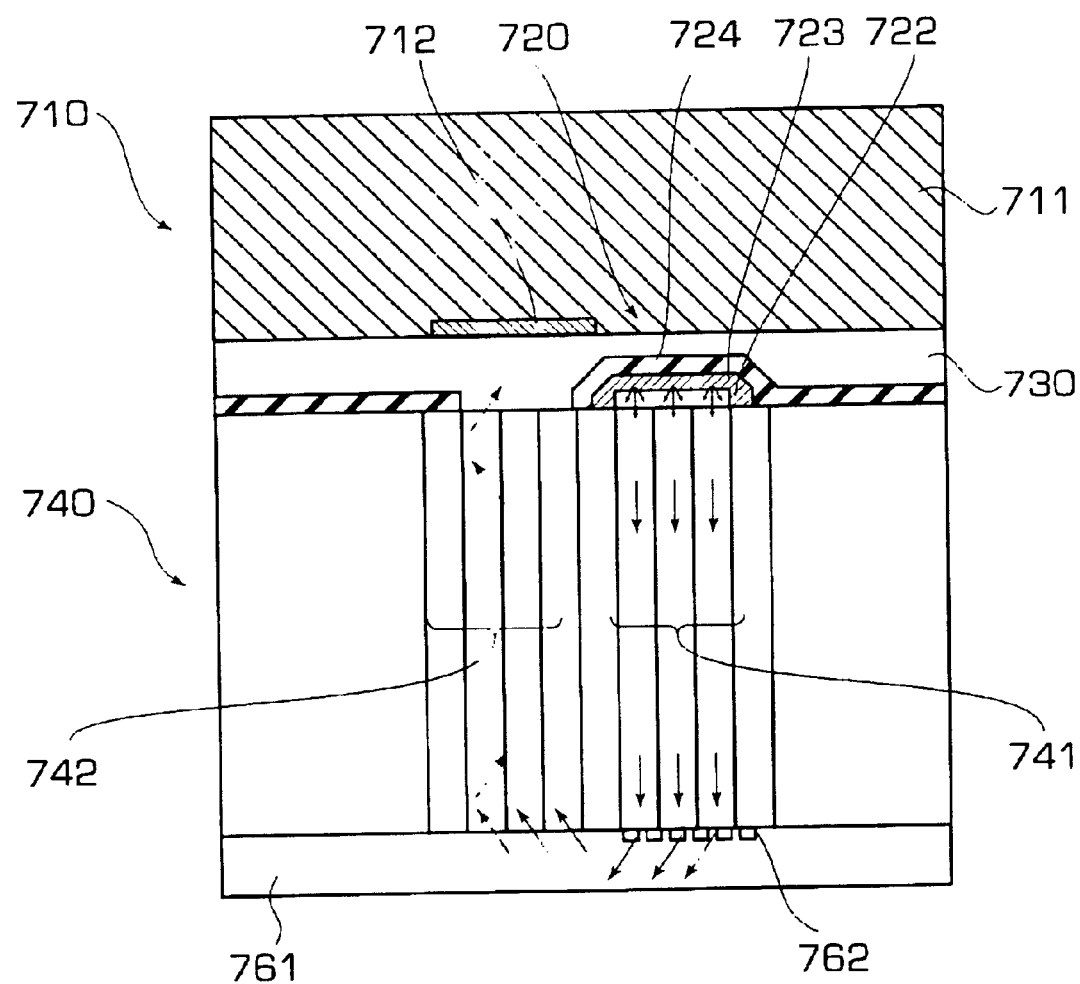
FIG. 14 is a sectional view showing a structure of an image sensor device of a seventh embodiment of the present invention.

FIG. 14 is a sectional view showing the structure of an image sensor of a seventh embodiment of the present invention. The image sensor of this embodiment has a feature that a diffraction grating 762 is inserted between the transparent substrate 561 and the optical fiber collection member 540 of the fifth embodiment of the present invention of FIG. 12.

Next, an operation of the image sensor of this embodiment will be described. Similar to the fifth embodiment, light analogous to parallel light is transmitted through an optical fiber 741. A diffraction light of a high order produced by the diffraction grating 762 appears in the direction shown in FIG. 14 and illuminates a document. The reflected light is transmitted through an optical fiber 742, and detected by a photoelectric conversion element 712. Here, it is also possible to input a fingerprints instead of the document. Specifically, when a finger tightly contacted to the transparent substrate 761 is obliquely illuminated by a high order diffraction light, total reflection conditions are satisfied at an interface of the transparent substrate 761 on the finger side in the case where ridges of the finger are not in contact with the transparent substrate 761. Thus, the intense reflected light is incident onto the optical fiber 742. On the contrary, where the ridges of the finger are in contact with the transparent substrate, the total reflection conditions are disturbed, the light is scattered. Therefore, the scattered light incident onto the optical fiber 742 is not intense little. As described above, the existence of the ridges of the finger, namely, the image of the fingerprint is optically enhanced. It should be noted that optical means for realizing enhancement of the image of the fingerprints utilizing this total reflection is not limited to the diffraction grating. For example, as is disclosed in Japanese Patent No. 2025659 (U.S. Pat. No. 5,446,290) applied by the applicant of the present invention, using a reflection mirror provided on the slant surface of a V-shaped groove and a micro lens, the course of parallel light in the vertical direction is converted to an oblique direction, whereby enhancing of the image of the fingerprints can be similarly realized. Therefore, the constitution using these optical means is considered to be in the scope of the modified embodiment of the present invention.

Figure 15:
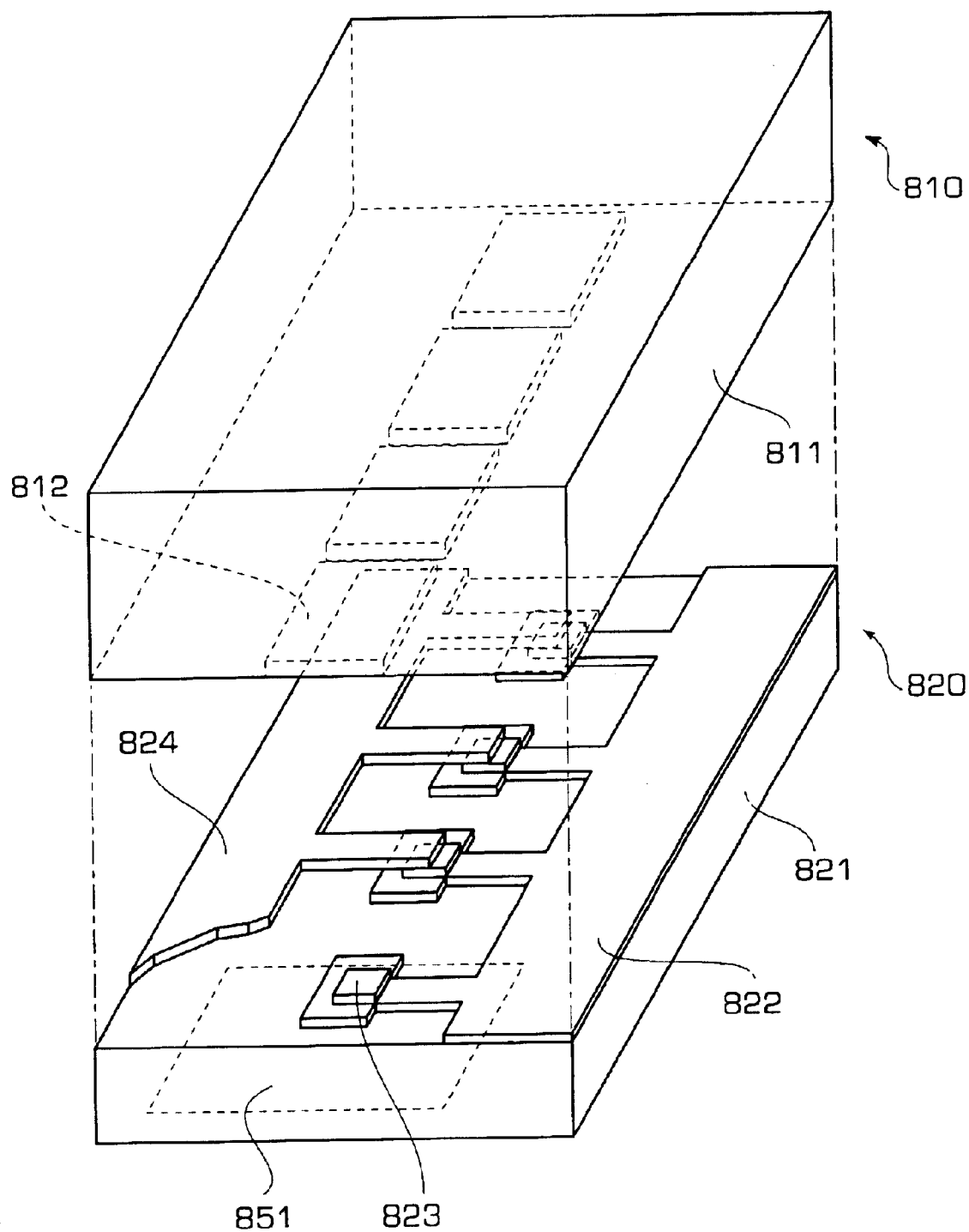
FIG. 15 is a sectional view showing a structure of an image sensor device of a eighth embodiment of the present invention.

FIG. 15 is an exploded perspective view showing the structure of an image sensor device of an eighth embodiment of the present invention. The image sensor device of this embodiment has a feature that a reflection layer 851 is formed at the position corresponding to the specified photoelectric conversion element and on the surface of the transparent substrate 121 of the first embodiment of the present invention of FIG. 7. Moreover, sensitivity adjusting means (not shown) for adjusting the sensitivity of an output from the whole of the image sensor 810 according to the output from this photoelectric conversion element is provided.

Next, an operation of the image sensor device of this embodiment will be described. Similar to the first embodiment, the light emitted from the light emission layer 823 irradiates the document, and the reflected light from the document is detected by the photoelectric conversion element 812, whereby reading-out for the document is performed. These operations are the same as those of the foregoing embodiments. However, in case of the specified photoelectric conversion element 812 having the reflection layer 851, the reflected light from the document does not reach this photoelectric conversion element 812, but the light from the light source reaches the element 812 after being reflected by the reflection layer 851. Therefore, the output of the photoelectric conversion element 812 is in proportion to the intensity of light emission of the light source. Even if the intensity of light emission of the light source decreases after the use for a long period of time, the operation of the image sensor device can still be secured by increasing the sensitivity of the image sensor 810 according to the output of this specified photoelectric conversion element 812.

Figure 16:
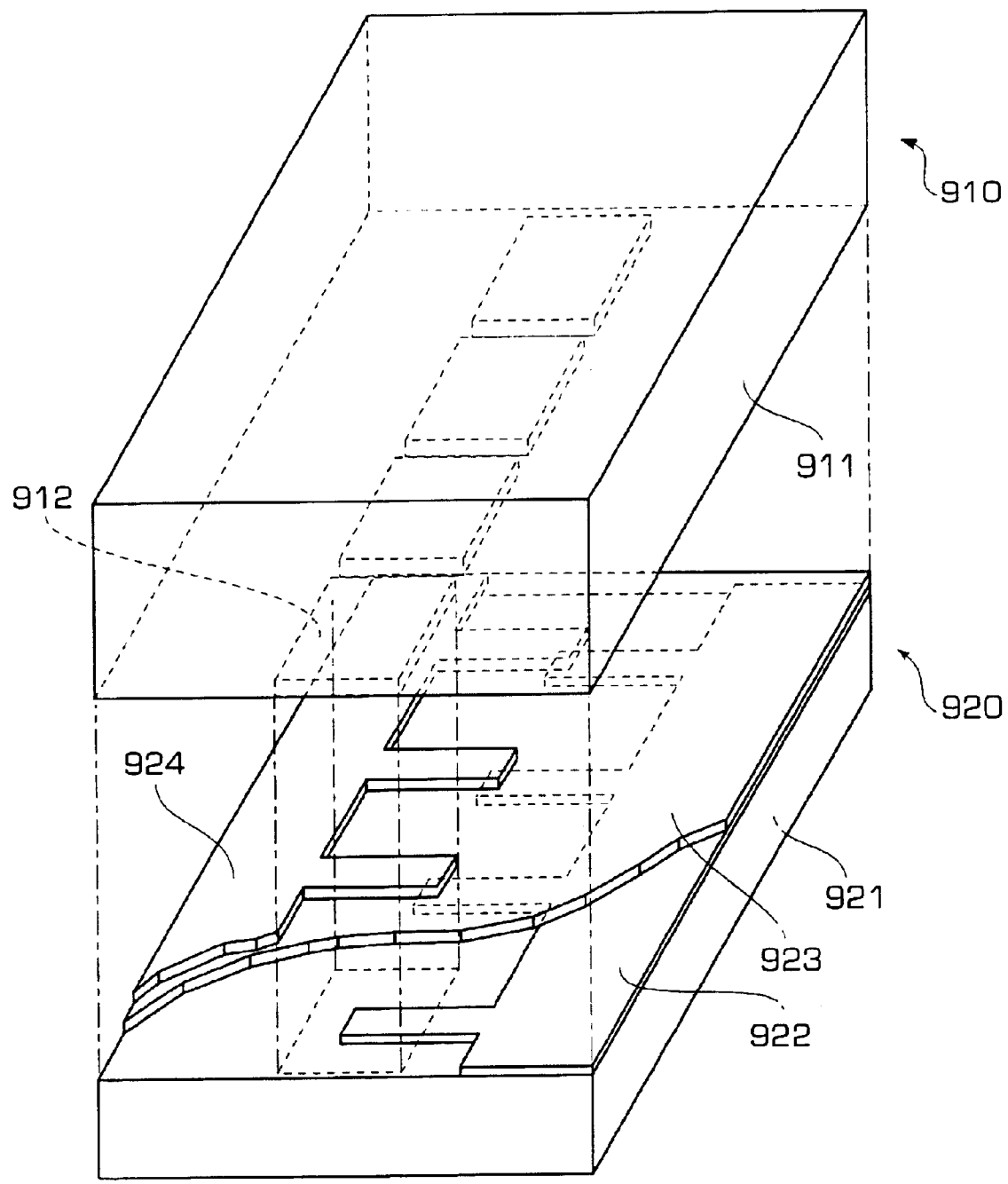
FIG. 16 is a sectional view showing a structure of an image sensor device of a ninth embodiment of the present invention.

FIG. 16 is an exploded perspective view showing the structure of an image sensor of a ninth embodiment of the present invention. In the first embodiment of the present invention of FIG. 7, the light emission layer 123 is subjected to patterning. The image sensor of this embodiment has a feature that the light emission layer 923 is uniformly formed on the entire surface of the resultant structure. By simplifying the manufacturing steps, it is possible to achieve a reduction in manufacturing cost.

Figure 17:
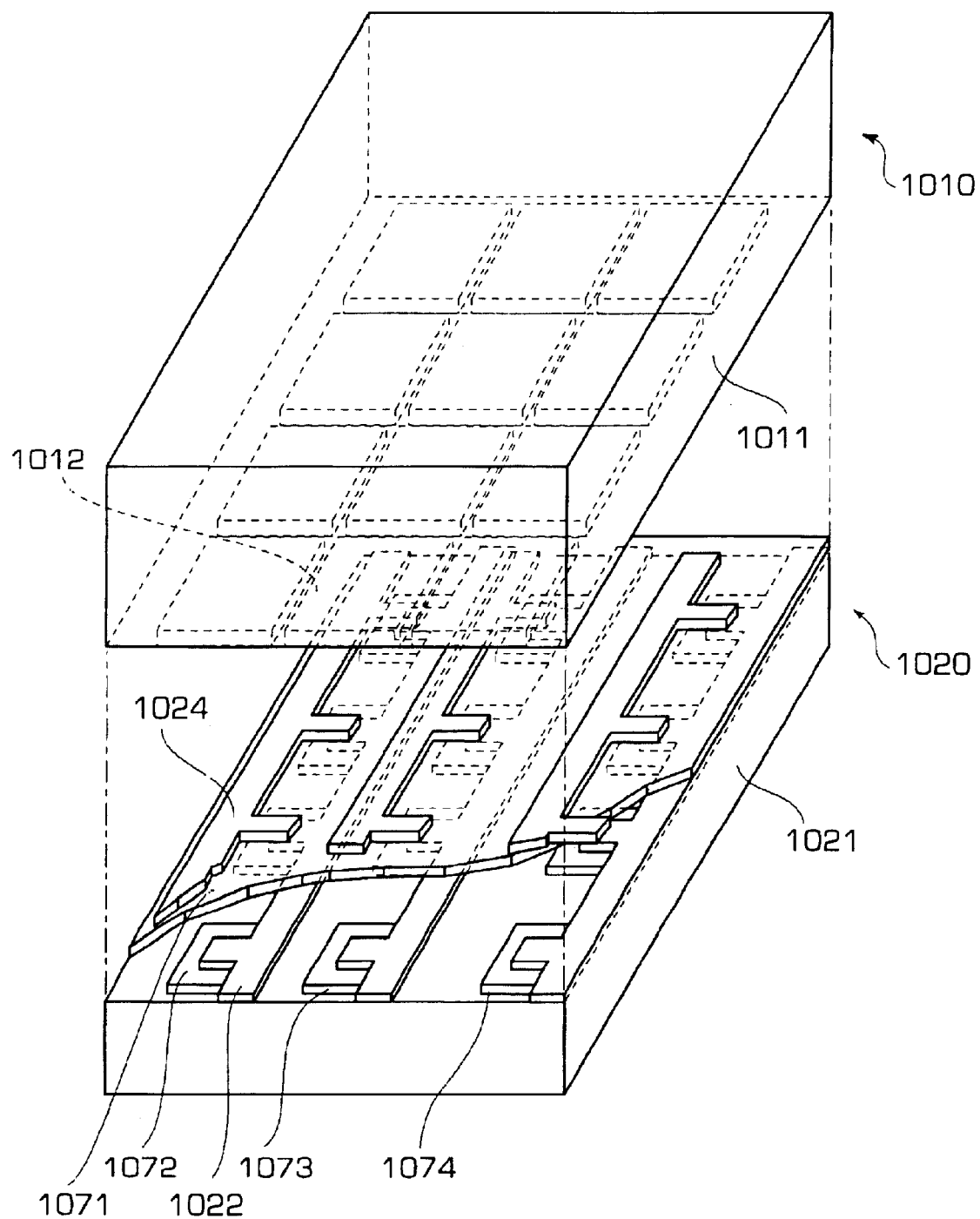
FIG. 17 is a sectional view showing a structure of an image sensor device of a tenth embodiment of the present invention.

FIG. 17 is an exploded view showing the structure of an image sensor of a tenth embodiment of the present invention. The image sensor of this embodiment has a feature that instead of the light emission layer 123 of the first embodiment of the present invention of FIG. 7, a blue light emission layer 1071 is uniformly formed on the entire surface of the resultant structure, color changing layers 1072 (blue to blue), 1073 (blue to green) and 1074 (blue to red) are formed between the transparent substrate 1021 and the transparent electrode 1022. Moreover, photoelectric conversion elements 1012 are provided by three rows, and the same number of light emission portions are provided corresponding to them.

Next, an operation of the image sensor of the tenth embodiment of the present invention will be described. The blue light emitted from the blue light emission layer 1071 is converted into, for example, green color by the color changing layer 1073 to irradiate the document. The reflected light from the document is detected by the photoelectric conversion element 1012, whereby green color information of the document is read out. Similarly, information of red and blue colors of the document can be obtained by the photoelectric conversion element and the light emission portion which correspond to these colors. It should be noted that illumination light of three colors limitedly illuminates the parts of the document corresponding to the light emission portions. Therefore, since no color mixing on the document occurs, it is not necessary to provide a color filter in the photoelectric conversion element. Specifically, since no light absorption by the color filter occurs, a color image input with a high sensitivity can be realized. Moreover, similar to the first embodiment, a high resolution image input is possible with a low power consumption.

In the present invention, by providing a light emission portion corresponding to each photoelectric conversion element, it is possible to limit the illuminate only a part of the document so that reading-out of the document is possible with a high resolution.

Furthermore, since a power consumption of the light source can be reduced by utilizing a light emission efficiently, the image sensor device of the present invention can be advantageously installed into portable type equipments.

Furthermore, according to the present invention, by illuminating a finger after changing the course of light obliquely, it is possible to enhance the fingerprints image contrast by total reflection.

In addition, light emitted from the light source is guided to the specified photoelectric conversion element of the image sensor and the sensitivity of the image sensor is adjusted depending on the variation of the intensity of light emission of the light source, whereby it is possible to provide the image sensor device which is capable of performing operations stably.

According to the present invention, since the image sensor of the present invention has the functions as described above and is constituted as described above, it is possible to provide an excellent image sensor device which did not heretofore exist.

It is understood, however, that although the characteristics and advantages of the present invention have been set forth in the foregoing description, the disclosure is illustrative only, and changes may be made in the arrangement of the parts within the scope of the appended claims.

What is claimed is:

1. An image sensor device which optically reads out a document comprising:
   an image sensor portion having a plurality of light receiving elements facing a document to be read out; and
   a thin film light source arranged on the document side of said image sensor portion, said thin film light source emitting light to said document,
   wherein said thin film light source includes a plurality of light emission portions, each of said light emission portions emitting light to said document, and corresponding to each of said light receiving elements, said light emission portions including a light blocking layer on said light receiving elements side, and said light emission portions being arranged between said light receiving elements and said document, at least one of said light emission portions where said light originates being substantially aligned with a corresponding light receiving element.

2. The image sensor device according to claim 1, wherein each of the light emission portions of said thin film light source comprises a transparent electrode, an opaque electrode and an organic thin film held between the transparent and opaque electrodes and said opaque electrode is formed of a material which functions as a light blocking layer for a region other than said light receiving element of said image sensor section.

3. The image sensor device according to claim 1, further comprising light blocking means provided at a region other than said plurality of light receiving elements of said image sensor portion.

4. The image sensor device according to claim 1, wherein said image sensor portion includes image sensors formed on a crystalline silicon wafer or image sensors formed on a transparent substrate by thin film semiconductor processes.

5. The image sensor device according to claim 1, wherein said thin film light source emits light of a plurality of different colors.

6. The image sensor device according to claim 1, wherein an optical fiber collection member is provided between said thin film light source and said document.

7. An image sensor device which optically reads out a document comprising:
   an image sensor portion having a plurality of light receiving elements; and
   a thin film light source arranged on a document side of said image sensor portion, said thin film light source emitting light to said document,
   wherein light emission portions of said thin film light source emit light to said document, and are arranged in one-to-one correspondence to each of said light receiving elements,
   said light emission portions include a light blocking layer on a side facing said light receiving elements and are arranged between said light receiving elements and said document, and
   at least one of said light emission portions where said light originates is substantially aligned with a corresponding light receiving element.

8. The image sensor device according to claim 1, wherein each of said light emission portions is substantially centered with respect to said corresponding light receiving element.

9. The image sensor device according to claim 1, wherein each of said light emission portions has an area smaller than an area of a corresponding light receiving element of said plurality of light receiving elements.

10. The image sensor device according to claim 1, wherein substantially all surface area of said at least one of said light emission portions is between said corresponding light receiving element and said document.

11. The image sensor device according to claim 2, wherein said organic thin film comprises a plurality of individual and separate organic thin film areas, each of said organic thin film areas held between the transparent and opaque electrodes.

12. The image sensor device according to claim 7, wherein said at least one of said light emission portions is substantially centered with respect to said corresponding light receiving element.

13. The image sensor device according to claim 7, wherein substantially all surface area of said at least one of said light emission portions is between said corresponding light receiving element and said document.

14. The image sensor device according to claim 7, wherein each of said light emission portions is substantially centered with respect to a corresponding light receiving element of said plurality of light receiving elements.

15. The image sensor device according to claim 7, wherein each of the light emission portions comprises a transparent electrode, an opaque electrode and an organic thin film, said organic thin film further comprising a plurality of individual and separate organic thin film areas each of said organic thin film areas held between the transparent and opaque electrodes, and said opaque electrode is formed of a material which functions as a light blocking layer for a region other than said light receiving element of said image sensor section.

16. An image sensor device which optically reads out a document comprising:

an image sensor portion having a plurality of light receiving elements; and a thin film light source arranged on a document side of said image sensor portion, said thin film light source emitting light to said document, wherein light emission portions of said thin film light source are arranged in one-to-one correspondence to each of said light receiving elements, said light emission portions emit light to said document, include a light blocking layer on a side facing said light receiving elements, and are arranged between said light receiving elements and said document, and at least one of said light emission portions where said light originates and a light receiving element corresponding to said at least one of said light emission portions substantially overlap.

* * * * *

UNITED STATES PATENT AND TRADEMARK OFFICE
CERTIFICATE OF CORRECTION

PATENT NO. : 6,815,654 B1
APPLICATION NO. : 08/932238
DATED : November 9, 2004
INVENTOR(S) : Ichiro Fujieda and Takeshi Saito It is certified that error appears in the above-identified patent and that said Letters Patent is hereby corrected as shown below:

Title Page, Item (54) and at Column 1, lines 1-4, in the Title:

In Line 1, delete "IMAGE SENSOR DEVICE USING THIN FILM LIGHT SOURCE ARRANGED LIGHT RECEIVING ELEMENTS AND IMAGE TO BE SENSED" and replace with "IMAGE SENSOR DEVICE USING THIN FILM LIGHT SOURCE ARRANGED BETWEEN LIGHT RECEIVING ELEMENTS AND IMAGE TO BE SENSED"

Signed and Sealed this
Twelfth Day of July, 2011

David J. Kappos
*Director of the United States Patent and Trademark Office*